(12) United States Patent
Feltz et al.

(10) Patent No.: US 8,858,822 B2
(45) Date of Patent: *Oct. 14, 2014

(54) CERAMIC MATERIAL

(75) Inventors: Adalbert Feltz, Deutschlandsberg (AT); Heinz Florian, Bad Gams (AT); Michael Schossmann, Frauental (AT)

(73) Assignee: EPCOS AG, Munich (DE)

( * ) Notice: Subject to any disclaimer, the term of this patent is extended or adjusted under 35 U.S.C. 154(b) by 2185 days.

This patent is subject to a terminal disclaimer.

(21) Appl. No.: 10/586,035

(22) PCT Filed: Jan. 14, 2005

(86) PCT No.: PCT/DE2005/000045
§ 371 (c)(1),
(2), (4) Date: Dec. 19, 2006

(87) PCT Pub. No.: WO2005/069396
PCT Pub. Date: Jul. 28, 2005

(65) Prior Publication Data
US 2007/0158608 A1    Jul. 12, 2007

(30) Foreign Application Priority Data
Jan. 15, 2004    (DE) .................. 10 2004 002 204

(51) Int. Cl.
| | | |
|---|---|---|
| *C04B 35/00* | (2006.01) |
| *H01L 41/00* | (2013.01) |
| *H02N 2/00* | (2006.01) |
| *C04B 35/493* | (2006.01) |
| *C04B 35/626* | (2006.01) |
| *C04B 35/491* | (2006.01) |
| *H01L 41/187* | (2006.01) |
| *H01L 41/083* | (2006.01) |
| *C04B 35/63* | (2006.01) |

(52) U.S. Cl.
CPC ....... *C04B 35/491* (2013.01); *C04B 2235/3215* (2013.01); *C04B 2235/3294* (2013.01); *C04B 35/493* (2013.01); *C04B 35/6263* (2013.01); *C04B 2235/5445* (2013.01); *C04B 2235/3262* (2013.01); *C04B 2237/346* (2013.01); *C04B 2235/3203* (2013.01); *C04B 2235/3241* (2013.01); *C04B 2237/348* (2013.01); *C04B 2235/3279* (2013.01); *C04B 2237/407* (2013.01); *C04B 2235/3272* (2013.01); *C04B 2235/3213* (2013.01); *B32B 2311/12* (2013.01); *C04B 2235/3251* (2013.01); *H01L 41/1876* (2013.01); *C04B 2235/3281* (2013.01); *C04B 2235/3208* (2013.01); *C04B 2235/3275* (2013.01); *C04B 2235/3296* (2013.01); *C04B 2235/3284* (2013.01); *H01L 41/083* (2013.01); *C04B 2235/76* (2013.01); *C04B 2235/326* (2013.01); *C04B 2235/3255* (2013.01); *C04B 35/6303* (2013.01); *C04B 2235/3206* (2013.01); *C04B 2235/3201* (2013.01); *C04B 2235/3286* (2013.01); *C04B 2235/6582* (2013.01)
USPC .............................. 252/62.9 PZ; 310/313 B

(58) Field of Classification Search
CPC ................ C04B 35/491; C04B 35/499; C04B 2235/3253
USPC .............. 252/62.9 R, 62.9 PZ; 501/134–136; 310/313 B
See application file for complete search history.

(56) References Cited

U.S. PATENT DOCUMENTS 2,960,411 A    11/1960  Brajer et al.
3,330,697 A    7/1967   Pechini
(Continued)

FOREIGN PATENT DOCUMENTS

DE    1217836    5/1966
DE    2359818    6/1975
(Continued)

OTHER PUBLICATIONS

Garg. Effect of net PbO content on mechanical and electromechanical properties of lead zirconate titanate ceramics. Materials Science and Engineering B56 (1999) 46-50.*

(Continued)

*Primary Examiner* — Matthew E Hoban
(74) *Attorney, Agent, or Firm* — Fish & Richardson P.C.

(57) ABSTRACT

A ceramic material includes first and second ceramic materials. The first ceramic material has a perovskite structure and defines a host lattice. The first ceramic material contains lead, zirconium and titanium, e.g., lead zirconate titanate. The second ceramic material has a cryolite structure. The ceramic material may be part of a piezo-actuator containing ceramic layers formed of the ceramic material.

9 Claims, 1 Drawing Sheet

(56) References Cited

U.S. PATENT DOCUMENTS

| | | | |
|---|---|---|---|
| 3,423,686 A | | 1/1969 | Ballman et al. |
| 3,438,723 A | | 4/1969 | Pechini |
| 3,956,150 A | * | 5/1976 | Ouchi et al. ............ 252/62.9 PZ |
| 4,882,079 A | * | 11/1989 | Tomita et al. .......... 252/62.9 PZ |
| 5,004,555 A | | 4/1991 | Cheng et al. |
| 5,094,987 A | * | 3/1992 | Kagata et al. ................. 501/136 |
| 5,279,996 A | * | 1/1994 | Hase et al. .................... 501/136 |
| 5,419,844 A | | 5/1995 | Hase et al. |
| 5,434,102 A | | 7/1995 | Watanabe et al. |
| 5,459,115 A | * | 10/1995 | Kagata et al. ................. 501/135 |
| 5,508,226 A | | 4/1996 | Ito et al. |
| 5,527,481 A | * | 6/1996 | Otsu et al. ................. 252/62.9 R |
| 5,601,869 A | | 2/1997 | Scott et al. |
| 5,648,012 A | | 7/1997 | Higashibeppu et al. |
| 5,825,057 A | | 10/1998 | Watanabe et al. |
| 5,897,373 A | * | 4/1999 | Peng et al. .................... 438/653 |
| 6,072,207 A | | 6/2000 | Yoshimori et al. |
| 6,174,564 B1 | | 1/2001 | Scott et al. |
| 6,312,816 B1 | | 11/2001 | Roeder et al. |
| 6,411,012 B2 | | 6/2002 | Furukawa et al. |
| 6,423,245 B1 | | 7/2002 | Ogiso |
| 6,454,964 B1 | | 9/2002 | Scott et al. |
| 6,610,427 B2 | * | 8/2003 | Kashiwaya et al. .......... 428/701 |
| 6,692,651 B2 | | 2/2004 | Helke |
| 6,773,621 B2 | | 8/2004 | Hammer et al. |
| 6,806,625 B2 | | 10/2004 | Ogawa et al. |
| 6,979,410 B2 | | 12/2005 | Sasaki |
| 7,045,075 B2 | | 5/2006 | Kasukawa et al. |
| 7,101,490 B2 | | 9/2006 | Helke |
| 7,387,745 B2 | | 6/2008 | Helke |
| 7,999,448 B2 | * | 8/2011 | Feltz et al. .................... 310/358 |
| 2003/0174553 A1 | * | 9/2003 | Saito et al. .................... 365/200 |

FOREIGN PATENT DOCUMENTS

| | | |
|---|---|---|
| DE | 198 40 488 | 3/1999 |
| DE | 101 01 188 | 8/2002 |
| DE | 10229086 | 4/2003 |
| DE | 10231471 | 6/2003 |
| DE | 10142268 | 2/2007 |
| EP | 0 344 978 | 5/1989 |
| EP | 0 413 321 | 6/1995 |
| EP | 0 698 587 | 11/1997 |
| EP | 0 575 966 | 4/1998 |
| EP | 1107325 | 6/2001 |
| EP | 0 665 981 | 3/2002 |
| EP | 1 382 587 | 1/2004 |
| JP | 5-319925 | 12/1993 | ............. C04B 35/49 |
| JP | 07-277822 | 10/1995 | |
| JP | 2001-515835 | 9/2001 | ............. C04B 35/49 |
| JP | 2003-55045 | 2/2003 | ............. C04B 35/49 |
| WO | WO97/40537 | 10/1997 |
| WO | WO99/12865 | 8/1999 |
| WO | WO99/42282 | 8/1999 |
| WO | WO02/055450 | 7/2002 |
| WO | WO02/081404 | 10/2002 |
| WO | WO03/029162 | 4/2003 |
| WO | WO03/029164 | 4/2003 |

OTHER PUBLICATIONS

Zheng. Effects of strontium substitution in Nb-doped PZT ceramics. Journal of the European Ceramic Society vol. 21, Issues 10-11, 2001, pp. 1371-1375.*
English translation for Written Opinion for PCT/DE2005/000045.
Rompp, "Kryolith"; 2005 Georg Thieme Verlag.
Schuh, C. et al "AG Doping of Rare Earth Modified PZT" Proc Electroceramics V, University of Aveiro, 1996, vol. 1, pp. 201-204.
Leshchenko et al., "Phase Diagram of SrO-Nb2O5 [Figure 1]", from "The System SrO-Nb2O5", INOMAF 18(7), p. 1014 (1982); In English translation of Izvestiya Akademii Nauk SSSR, Neorganicheskie Materialy, vol. 18(7), pp. 1202-1205, (Jul. 1982).
English translation of examination report dated Sep. 22, 2010 for corresponding application JP 2006-548107.
Yokosuka, Masaru "Study of Hot-Pressed Ba (Ca⅓ Nb⅔)O$_3$-PbZrO$_3$-PbTiO$_3$ Ceramics. I Electrical and Optical Properties at Room Temperature" Japanese J of Applied Physics, vol. 25, No. 7, Jul. 1986, pp. 993-996.
English Translation of Notification of Reasons for Refusal (Type I office action) for Japanese Patent Application No. 2006-548107 dated Jun. 23, 2011.

* cited by examiner

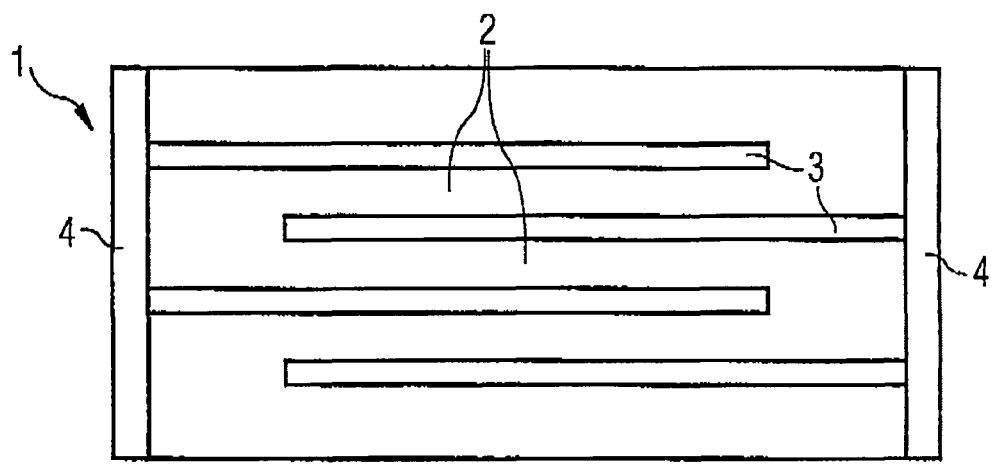

CERAMIC MATERIAL

TECHNICAL FIELD

This patent application is directed to a ceramic material based on lead zirconate titanate (PZT). It is suited for the construction of piezoceramic multilayer components and exhibits an outstanding thermal and temporal stability of the piezoelectric characteristics under functional loading.

BACKGROUND

The use of such piezoceramic components as sensors or actuators, especially in automotive engineering, is due to their high reliability and temporal stability, as well as an adequate thermal stability, while at the same time having relatively large deflections when an electrical voltage is applied. These attributes require one to establish a particular ratio of Zr to Ti in the perovskite structure $ABO_3$ of PZT, corresponding to the so-called morphotropic phase boundary MPB. The piezoelectric properties take on especially advantageous values in the MPB composition range. Furthermore, the functional properties of the lead zirconate titanate ceramic can be adapted very much to the particular application by adding certain additives which go into solid solution in the perovskite structure. In general, one will try not to lower too much the relatively high value of the Curie temperature of around 360° C., responsible for the thermal stability of the piezoelectric properties, as a result of such modifications, which can be accomplished by keeping the concentration of the additive component low.

From publication WO 97/40537 there is known a PZT ceramic which calls for a doping at the A-site of the perovskite structure to improve the properties of the ceramic. A rare earth metal, such as lanthanum or neodymium, is chosen for the A-site doping.

Moreover, a composition $Pb_{0.97}Nd_{0.02}[(Zr_{0.3}Ti_{0.4}(Ni_{1/3}Nb_{2/3})_{0.3})O_3]$ is known from the publication of Schuh et al., Proc. Electroceramics V, Aveiro 1996 Vol. 1, 201. Furthermore, the incorporation of the compound $Sr(K_{0.25}Nb_{0.75})O_3$ in the perovskite lattice of PZT is described in the publication DE 198 40 488 A1.

SUMMARY

Described herein is a ceramic material that is composed of a first ceramic material with a perovskite structure as the host lattice, containing lead, zirconium and titanium, and a second ceramic material with a cryolite structure.

Also described is a ceramic material that contains mixed crystals of a first ceramic material and a second ceramic material. The first ceramic material has a perovskite structure and contains lead, zirconium and titanium. The second ceramic material has a cryolite structure.

The first ceramic material may have a composition $Pb(Zr, Ti)O_3$, known as PZT. The following embodiments refer primarily to the first ceramic material.

One embodiment of the ceramic material is based on a partial substitution of $Pb^{II}$ and $Zr^{IV}/Ti^{IV}$ in the $Pb(Zr, Ti)O_3$ ceramic with ions of comparably ionic radius, such as $A^{II}$ cations ($A^{II}$: Ba, Sr, Ca) at the A-sites and $B^{IV}$ cations ($B^{IV}$: Sn) at the B-sites of the perovskite structure. In the framework of such a mixed crystal formation, a wide variety of modifications are possible by aliovalent substitution. These may include a pairwise substitution with valency compensation between the A and B-sites of the perovskite structure, for example, with $A^I$ cations ($A^I$: K, Ag) and $B^V$ cations ($B^V$: Nb, Ta, Sb) and their combinations, or one may consider $A^{III}$ cations ($A^{III}$: $La^{III}$, $REA^{III}$, $Bi^{III}$) and $B^{III}$ cations ($B^{III}$: Al, Co, Mn) and their combinations. Mixed crystals of the above three versions are also possible.

Besides pairwise coupled substitution with valency compensation, in which one can achieve a high degree of substitution, it is also possible to perform a substitution without valency compensation, adhering to narrow concentration limits for the added component. In this case, lattice sites remain unoccupied temporarily during the sintering, or even permanently. In this way, sinter compaction and grain formation are encouraged, and especially advantageous piezoelectrical and piezomechanical functional properties result when the Zr/Ti ratio is adjusted to the MPB.

Soft piezoceramics with a relatively shallower trend for the ferroelectric hysteresis curve on the polarization v. field strength diagram can be achieved by incorporating higher-valency cations at the A-sites, i.e., $A^{III}$ instead of $Pb^{II}$, or by incorporating higher-valency cations $B^V$ instead of $Zr^{IV}/Ti^{IV}$ at the B-sites, without having any valency compensation as in the case of the pairwise coupled substitution. Thanks to the vacancies created at the A-sites by reason of such a doping, the growth of grains is kinetically favored in the sintering process, as is the movement of the domain walls when an electric field is applied, which results in high values of the dielectric constant $\in$ and large deflection amplitudes under relatively moderate field strength of around 2 kV/mm, although this also entails reduced elasticity and increased dielectric losses.

Piezoceramic systems of this type correspond, for example, to the formula $Pb_{1-3x/2}La_xV_{Pb,x/2}(Zr_{0.53}Ti_{0.47})O_3$ ($V_{Pb}$=vacancy at $Pb^{II}$ site) (0.005<x<0.02), while instead of $La^{III}$ one can also consider other cations of the rare earth element $REA^{III}$, such as $Nd^{III}$ in $Pb_{1-3x/2}Nd_xV_{Pb,x/2}(Zr_{0.53}Ti_{0.47})O_3$ with x=0.02. It can be shown that such a ceramic in the multilayer component of an actuator with Ag/Pd inner electrodes after sintering in air takes on the composition $Pb_{0.96}Nd_{0.02}Ag_{0.02}(Zr_{0.54}Ti_{0.46})O_3$ as a result of $Ag^I$ ions migrating into the vacancies. Further substitutions by cations of the rare earths $Pb_{0.97}A^{III}_{0.02}V_{Pb,0.01}(Zr_{0.535}Ti_{0.465})O_3$ with A=La, Nd, Eu, Gd, Er, and also Bi, are likewise possible. The variant of a substitution of B-sites without valency compensation in the case of niobium-doped piezoceramics occurs as $Pb_{1-x/2}V_{Pb,x/2}(Zr_{1-p}Ti_p)_{1-x}Nb_xO_3$. The complex composition of a comparatively hard piezoceramic $Pb_{0.99}V_{0.01}\{[(Zr_xSn_{1-x})_{1-y}Ti_y]_{0.98}Nb_{0.02}\}O_3$ can also be included in such a context.

So-called hard piezoceramics with a steeper ferroelectric hysteresis curve in the plot of polarization v. field strength can be produced by incorporating cations with lower valency at the A-sites, i.e., $A^I$ instead of $Pb^{II}$, or by incorporating lower valency cations at the B-sites of the perovskite structure, i.e., in the latter case, $B^{III}$ cations such as $Al^{III}$, $Fe^{III}$, $Cr^{III}$ or $Ga^{III}$, or $B^{II}$ cations such as $Mg^{II}$, $Ca^{II}$, $Ni^{II}$, $Co^{II}$ or $Mn^{II}$ instead of $Zr^{IV}/Ti^{IV}$. Such a doping entails, at high temperature, the formation of vacancies in the oxygen sublattice, so that in particular the sinter compaction in the thermal ceramization process undergoes a significant increase. But in the cooldown process the vacancies should be very extensively filled by oxygen, or else the insulation resistance and the stability to aging will be negatively affected. Hard piezoceramics, such as $Pb_{1-x}K_x(Zr_{0.65}Ti_{0.35})O_{3-x}V_{O,x/2}$ ($V_O$ stands here for an oxygen vacancy) generally have a larger coefficient of elasticity, smaller dielectric constant $\in$, and lower dielectric losses.

The use of aliovalent substitutions without valency compensation by so-called "soft" additives, whose effect is partially offset by blending in "hard" components, has proven to be especially advantageous for adjusting the optimal piezoelectrical and piezomechanical functional properties.

Such combinations include the mixed occupancy of the B-sites by different cations, such that valency compensation with full occupancy of all lattice sites in the perovskite lattice is once again achieved. This results in an enormous broadening of the physical modifications of PZT ceramics.

In one implementation, when producing the material indicated herein, one will proceed such that compounds of suitable crystal chemistry, which crystallize in a structure derived from cryolite Na2(Na,Al)F6, form mixed crystals with the perovskite lattice of PZT and possibly also with mixed crystal systems without or with valency compensation.

An especially well suited compound with cryolite structure is $Sr_6Nb_2O_{11}$. The formulation $Sr_4(Sr_2Nb_2)O_{11}$, which is adapted to the structure, reveals the connection with the perovskite structure. Four $Sr^{II}$ cations as in the perovskite structure occupy the A-sites with coordination number 12, another two $Sr^{II}$ and two $Nb^V$ cations alternately occupy the B-sites with coordination number 6, which is reduced to 5 wherever an oxide ion is missing, since $1/12$ of the oxygen sites are unoccupied. Given a solid solution of this compound in the perovskite lattice of PZT, the result is a furthering of grain growth and contraction in the sintering process.

It has been found that $Sr_6Nb_2O_{11}$ has a phase range extending at high temperature far in the direction of a higher content of $Nb_2O_5$ and therefore it can be described by the general formula $Sr_{6-2x/3}Nb_{2+2x/3}O_{11+x}V_{1-x}$ or, adapting it to the cryolite structure, by $Sr_4(Sr_{2-2x/3}Nb_{2+2x/3})O_{11+x}V_{1-x}$ with $0<x<1$. Therefore, by using a content of $Nb_2O_5$ going beyond the composition of $Sr_6Nb_2O_{11}$, one can adjust the vacancy concentration and, in this way, produce a very advantageous material for piezoceramic applications, for example, in the system $[Pb(Zr_aTi_{1-a})O_3]_{1-b-c}[KNbO_3]_b[Sr_4(Sr_{2-2x/3}Nb_{2+2x/3})O_{11+x}V_{1-x}]_c$ in the limits $0.5<a<0.6$; $0<b<0.5$; $0<c<0.05$; $0<x<1$, where V denotes a vacancy in the oxygen sublattice.

The phase width of the cryolite component includes the possibility of a temperature-dependent variability for the oxygen vacancy concentration, for example, starting with the composition $Sr_4(Sr_{1.667}Nb_{2.333})O_{11.5}V_{0.5}$ with $x=0.05$, at sinter temperature of 950 to 1200° C. the solid solution of $Sr_4(Sr_2Nb_2)O_{11}V_1$ becomes effective with increased oxygen vacancy concentration according to the equation:

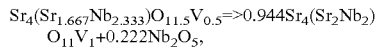

$$Sr_4(Sr_{1.667}Nb_{2.333})O_{11.5}V_{0.5} => 0.944 Sr_4(Sr_2Nb_2)O_{11}V_1 + 0.222 Nb_2O_5,$$

and the liberated $Nb_2O_5$ is bound by the PbO content used as a sintering agent as $PbNb_2O_6$ and incorporated into the PZT perovskite lattice with additional formation of vacancies at the A-sites. Due to the formation of oxygen vacancies, therefore, the system contains a mechanism which promotes sinter compaction under uniform grain growth. Upon cooldown and tempering, on the other hand, the reverse process is to be taken into account by

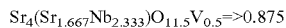

$$Sr_4(Sr_{1.667}Nb_{2.333})O_{11.5}V_{0.5} => 0.875$$

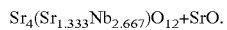

$$Sr_4(Sr_{1.333}Nb_{2.667})O_{12} + SrO.$$

This leads to a reduction or elimination of the oxygen vacancy concentration, which is advantageous to the long-term stability of the voltage-loaded piezoceramic component, while the segregated SrO, being a stronger base, supplants PbO from the $Pb(Zr_aTi_{1-a})O_3$ (PZT), i.e., some PbO is liberated and at the same time some $Sr(Zr_aTi_{1-a})O_3$ (SZT) is formed, and this in turn enters into a solid solution with the PZT host lattice.

Accordingly, $Sr_4(Sr_2Nb_2)O_{11}V_1$ can also be incorporated into the PZT host lattice as $0.75 Sr_4(Sr_{1.333}Nb2.667)O_{12}$ without formation of oxygen vacancies or in all intermediate stages, in which case $\leq 2Sr(Zr_aTi_{1-a})O_3$ (SZT) is formed and dissolved in the host lattice. Likewise, $Sr_4(Sr_{1.333}Nb_{2.667})O_{12}$ itself can act as a source of oxygen vacancies, by incorporating $0.889 Sr_4(Sr_2Nb_2)O_{11}V_1$ or in one of the intermediate stages, and forming 0.444 of $PbNb_2O_6$, whose solid solution in the PZT perovskite lattice involves the formation of vacancies at A-sites.

Instead of $Sr_4(Sr_{2-2x/3}Nb_{2+2x/3})O_{11+x}V_{1-x}$, one can also use components with a cryolite structure, which contain $Ba^{II}$ ions instead of $Sr^{II}$ cations at the A-sites, and $Ca^{II}$ ions or $Mg^{II}$ ions instead of $Sr^{II}$ cations at the B-sites. This results in the following formulations for added components:

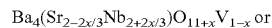

$$Ba_4(Sr_{2-2x/3}Nb_{2+2x/3})O_{11+x}V_{1-x} \text{ or}$$

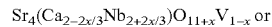

$$Sr_4(Ca_{2-2x/3}Nb_{2+2x/3})O_{11+x}V_{1-x} \text{ or}$$

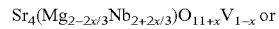

$$Sr_4(Mg_{2-2x/3}Nb_{2+2x/3})O_{11+x}V_{1-x} \text{ or}$$

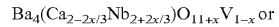

$$Ba_4(Ca_{2-2x/3}Nb_{2+2x/3})O_{11+x}V_{1-x} \text{ or}$$

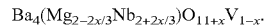

$$Ba_4(Mg_{2-2x/3}Nb_{2+2x/3})O_{11+x}V_{1-x}.$$

In this way, the range of variation of possible modifications of PZT ceramics is yet again substantially broadened.

A further diversity is produced in that, besides these modifications by compounds with a cryolite structure, one should consider not only $KNbO_3$ as a further added components, but also only can use one of the already mentioned perovskite components $Pb(M^{II}_{1/3}M^V_{2/3})O_3$ ($M^{II}$: Mg, Zn, Co, Ni, Mn, Cu and $M^V$: Nb, Ta, Sb) or $Pb(M^{II}_{1/2}M^{IV}_{1/2})O_3$ ($M^{II}$: Mg, Zn, Co, Ni, Mn, Cu and $M^{VI}$: W) or $Pb(M^{III}_{1/2}M^V_{1/2})O_3$ ($M^{III}$: Fe, Mn, Cr, Ga and $M^V$: Nb, Ta, Sb) or $Pb(M^{III}_{2/3}M^{VI}_{1/3})O_3$ ($M^{III}$: Fe, Mn, Cr, Ga and $M^{VI}$: W) and possibly also $Pb(M^I_{1/4}M^V_{3/4})O_3$ ($M^I$: Li, with $M^V$: Nb, Ta, Sb) and their mixtures.

This can be realized as additives with solid solution in the PZT perovskite lattice. Since it is always a question of these additives, compatible with the perovskite structure, being taken up by the perovskite host lattice, mixtures of the five mentioned versions should likewise be taken into account.

The large range of variation of the solutions described thus far is rounded out by formulas without valency compensation for mixed B-site occupancy, corresponding to a doping by so-called "soft" additives with partial compensation by mixing in some "hard" components, from which vacancies result in the perovskite lattice, having an especially advantageous impact on the grain formation in the sintering process, as well as the piezoelectrical and piezomechanical functional properties.

The variability described here for the properties of a PZT ceramic, such as is brought about by the incorporation of a cryolite phase with phase width, is distinguished in that the advantageous combination of so-called soft with hard components can be influenced and thereby specifically adjusted through the ratio of niobium to strontium or to one of the other alkaline earth elements and also by the temperature management.

The ceramic is explained more closely by the following sample embodiments and the accompanying FIGURE.

DESCRIPTION OF THE DRAWING

The FIGURE shows a piezo-actuator in a schematic lengthwise cross section.

DETAILED DESCRIPTION

The FIGURE shows a segment of a piezo-actuator 1, which is fabricated making use of the ceramic material described herein. One notices a stack of superimposed piezoelectrical ceramic layers 2, with electrode layers 3 lying in between. The piezo-actuator 1, moreover, has outer electrodes 4 on the ceramic body at the side. The making of the piezo-actuator 1 shown in the FIGURE occurs by forming ceramic green films, which are made from one of the ceramic materials described herein. A plurality of these green films, for example, 10 or even 100 of them, are stacked one on top of another. Between the ceramic green films are arranged electrode layers 3. The electrode layers 3 can include silver and palladium, for example. But the electrode layers 3 can just as well include copper. The electrode layers 3 can be placed on the individual ceramic green films, for example, by a silk screen process. The stacked ceramic green films are pressed together and then mutually debonded and sintered.

The result is a monolithic ceramic body with a stack of superimposed piezoelectric ceramic layers 2. The inner electrode layers 3 have structures meshing together as a comb, and every other electrode layer 3 makes contact with the very same outer electrode 4.

The electrical voltage needed for the electrical characterization of the piezo-actuator 1 is applied between the outer electrodes 4.

In order to make a ceramic material as described herein, one mixes a raw material mixture that includes $Pb_3O_4$ or $PbCO_3$, $TiO_2$, $ZrO_2$, or a precursor $(Zr, Ti)O_2$ prepared by mixture precipitation, as well as $SrCO_3$ and $Nb_2O_5$ and possibly other additives, such as $KNbO_3$ or $Pb(Fe_{0.5}Nb_{0.5})O_3$ corresponding to one of the sample compositions indicated in tables 1 to 16, in molar percent, or one can also use a mixture with the respective proportion of previously prepared cryolite phase.

Tables 1 to 6: Batches of a PZT ceramic $[Pb(Zr_aTi_{1-a})O_3]_{1-b-c}[KNbO_3]_b$, modified by additions of compounds with cryolite structure.

TABLE 1

$[Pb(Zr_aTi_{1-a})O_3]_{1-b-c}[KNbO_3]_b$
$[Sr_4(Sr_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.535 | b = 0 | c = 0.0082 | x = 0.5 |
| a = 0.535 | b = 0 | c = 0.0044 | x = 1.0 |
| a = 0.535 | b = 0 | c = 0.0076 | x = 1.0 |
| a = 0.53 | b = 0.002 | c = 0.0047 | x = 1.0 |
| a = 0.53 | b = 0.007 | c = 0.0035 | x = 0.5 |

TABLE 2

$[Pb(Zr_aTi_{1-a})O_3]_{1-b-c}[KNbO_3]_b$
$[Sr_4(Ca_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.53 | b = 0 | c = 0.0082 | x = 0.5 |
| a = 0.535 | b = 0 | c = 0.0044 | x = 1.0 |
| a = 0.535 | b = 0 | c = 0.0076 | x = 1.0 |
| a = 0.53 | b = 0.002 | c = 0.0047 | x = 1.0 |
| a = 0.53 | b = 0.007 | c = 0.0035 | x = 0.5 |

TABLE 3

$[Pb(Zr_aTi_{1-a})O_3]_{1-b-c}[KNbO_3]_b$
$[Sr_4(Mg_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.53 | b = 0 | c = 0.0082 | x = 0.5 |
| a = 0.535 | b = 0 | c = 0.0044 | x = 1.0 |
| a = 0.535 | b = 0 | c = 0.0076 | x = 1.0 |
| a = 0.53 | b = 0.002 | c = 0.0047 | x = 1.0 |
| a = 0.53 | b = 0.007 | c = 0.0035 | x = 0.5 |

TABLE 4

$[Pb(Zr_aTi_{1-a})O_3]_{1-b-c}[KNbO_3]_b$
$[Ba_4(Sr_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.53 | b = 0 | c = 0.0082 | x = 0.5 |
| a = 0.535 | b = 0 | c = 0.0044 | x = 1.0 |
| a = 0.535 | b = 0 | c = 0.0076 | x = 1.0 |
| a = 0.53 | b = 0.002 | c = 0.0047 | x = 1.0 |
| a = 0.53 | b = 0.007 | c = 0.0035 | x = 0.5 |

TABLE 5

$[Pb(Zr_aTi_{1-a})O_3]_{1-b-c}[KNbO_3]_b$
$[Ba_4(Ca_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.53 | b = 0 | c = 0.0082 | x = 0.5 |
| a = 0.535 | b = 0 | c = 0.0044 | x = 1.0 |
| a = 0.535 | b = 0 | c = 0.0076 | x = 1.0 |
| a = 0.53 | b = 0.002 | c = 0.0047 | x = 1.0 |
| a = 0.53 | b = 0.007 | c = 0.0035 | x = 0.5 |

TABLE 6

$[Pb(Zr_aTi_{1-a})O_3]_{1-b-c}[KNbO_3]_b$
$[Ba_4(Mg_{2-2x/3}Nb_{2+2x/3})O_{11+x}V_{1-x}]_c \cdot 0.01$ PbO

| | | | |
|---|---|---|---|
| a = 0.53 | b = 0 | c = 0.0049 | x = 0.5 |
| a = 0.53 | b = 0 | c = 0.0082 | x = 0.5 |
| a = 0.535 | b = 0 | c = 0.0044 | x = 1.0 |
| a = 0.535 | b = 0 | c = 0.0075 | x = 1.0 |
| a = 0.53 | b = 0.002 | c = 0.0047 | x = 1.0 |
| a = 0.53 | b = 0.007 | c = 0.0035 | x = 0.5 |

Tables 7 to 12:

Batches of a PZT ceramic $[Pb(Zr_aTi_{1-a})O_3]_{1-b-c}[Pb(Fe^{III}_{1/2}Nb^{V}_{1/2})O_3]_b$, modified by additions of compounds with cryolite structure.

TABLE 7

$[Pb(Zr_aTi_{1-a})O_3]_{1-b-c}[Pb(Fe^{III}_{1/2}Nb^{V}_{1/2})O_3]_b$
$[Sr_4(Sr_{2-2x/3}Nb_{2+2x/3})O_{11+x}V_{1-x}]_c \cdot 0.01$ PbO

| | | | |
|---|---|---|---|
| a = 0.53 | b = 0.003 | c = 0.0047 | x = 1.0 |
| a = 0.53 | b = 0.008 | c = 0.0035 | x = 0.5 |

TABLE 8

$[Pb(Zr_aTi_{1-a})O_3]_{1-b-c}[Pb(Fe^{III}_{1/2}Nb^{V}_{1/2})O_3]_b$
$[Sr_4(Ca_{2-2x/3}Nb_{2+2x/3})O_{11+x}V_{1-x}]_c \cdot 0.01$ PbO

| | | | |
|---|---|---|---|
| a = 0.53 | b = 0.002 | c = 0.0047 | x = 1.0 |
| a = 0.53 | b = 0.007 | c = 0.0035 | x = 0.5 |

TABLE 9

[Pb(Zr$_a$Ti$_{1-a}$)O$_3$]$_{1-b-c}$[Pb(Fe$^{III}_{1/2}$Nb$^V_{1/2}$)O$_3$]$_b$
[Sr$_4$(Mg$_{2-2x/3}$Nb$_{2+2x/3}$)O$_{11+x}$V$_{1-x}$]$_c$ · 0.01 PbO

| a = 0.53 | b = 0.002 | c = 0.0047 | x = 1.0 |
| a = 0.53 | b = 0.007 | c = 0.0035 | x = 0.5 |

TABLE 10

[Pb(Zr$_a$Ti$_{1-a}$)O$_3$]$_{1-b-c}$[Pb(Fe$^{III}_{1/2}$Nb$^V_{1/2}$)O$_3$]$_b$
[Ba$_4$(Sr$_{2-2x/3}$Nb$_{2+2x/3}$)O$_{11+x}$V$_{1-x}$]$_c$ · 0.01 PbO

| a = 0.53 | b = 0.002 | c = 0.0047 | x = 1.0 |
| a = 0.53 | b = 0.007 | c = 0.0035 | x = 5,0 |

TABLE 1

[Pb(Zr$_a$Ti$_{1-a}$)O$_3$]$_{1-b-c}$[Pb(Fe$^{III}_{1/2}$Nb$^V_{1/2}$)O$_3$]$_b$
[Ba$_4$(Ca$_{2-2x/3}$Nb$_{2+2x/3}$)O$_{11+x}$V$_{1-x}$]$_c$ · 0.01 PbO

| a = 0.53 | b = 0.002 | c = 0.0047 | x = 1.0 |
| a = 0.53 | b = 0.007 | c = 0.0035 | x = 0.5 |

TABLE 12

[Pb(Zr$_a$Ti$_{1-a}$)O$_3$]$_{1-b-c}$[Pb(Fe$^{III}_{1/2}$Nb$^V_{1/2}$)O$_3$]$_b$
[Ba$_4$(Mg$_{2-2x/3}$Nb$_{2+2x/3}$)O$_{11+x}$V$_{1-x}$]$_c$ · 0.01 PbO

| a = 0.53 | b = 0.002 | c = 0.0047 | x = 1.0 |
| a = 0.53 | b = 0.007 | c = 0.0035 | x = 0.5 |

The raw material mixtures are adjusted to the MPB in terms of the ratio of Zr to Ti and provided with a slight excess of PbO (around 2%) as sintering adjuvant, as appropriate, subjected to a grinding stage in aqueous suspension for an equal distribution of the components, and calcined at 900 to 950° C. after being filtered and dried. With this, the piezoceramic perovskite mixed crystal phase is already essentially formed.

Through subsequent fine grinding, one can adapt the sinter activity to the sinter temperature of around 1120° C. for Ag/Pd inner electrodes (75/25) or 1000° C. for Cu inner electrodes. In order to accomplish a sinter compaction already at 1000° C. below the melting temperature of copper, a fine grinding down to an average grain size of <0.4 µm may be used. The sinter activity of the powder will then be sufficient to ensure a compaction of >96% of the theoretical density, while at the same time having adequate grain growth and sufficient mechanical strength in the ceramic grain structure.

The finely ground powder is suspended through a dispersing agent into a watery slip with around 70 mass % solids content, corresponding to around 24 vol. %, and either converted into a pressable granulate by spraying or processed into ceramic green films. The proportion of dispersing agent needed for an optimal dispersion is ascertained separately in a series of experiments, and can be identified by achieving a minimum viscosity. To the dispersed suspensions of solid powders one adds 6-8 mass % of a bonding agent to achieve the processing properties needed for the film drawing process: binding agent on polyacrylate base or PVA base, e.g., polyvinylbutyral PVB, for multilayer piezo-components, e.g., actuators, with Ag/Pd inner electrodes; or one can use the thermohydrolytically more easily decomposed polyurethane in the case of a construction with Cu inner electrodes. After homogenization of the suspension, adjusted in this way to an optimal viscosity and surface tension, in a Dispermat mill, one obtains a slip suitable for the film drawing process.

Disk-shaped moldings, prepared from the granulate, or square multilayer plates (MLP), obtained by stacking and laminating the green films 40 to 50 µm thick, can be debonded in standard fashion, as can multilayer piezo-components, such as piezo-actuators, with up to 360 Ag/Pd inner electrodes. In the case of Cu inner electrodes, one maintains an oxygen partial pressure below the oxidation of copper during both the debonding and the sintering, which is achieved by having a controlled H20/H2 atmosphere, whose composition conforms to the kiln curve in the two thermal processes.

PZT ceramic samples debonded in this way enable a sinter compaction to yield a ceramic with advantageous grain structure for the piezoelectrical and piezomechanical properties. After producing contacts by sputtering of Au electrodes, one measures the dielectrical and especially the piezoelectrical properties of the resulting disk-shaped samples with dimensions of around 10×10 mm$^2$ and thickness of 0.7 or 2 mm. In the case of multilayer components, such as actuator specimens, one produces contacts by depositing and baking a bondable Ag or Cu termination.

The polar condition of the ferroelectric ceramic with a Curie temperature of 250 to 380° C., depending on composition, is adjusted by poling with around 2 kV/mm. Several of the piezoelectrical properties obtained on such specimens are presented in Table 13 for the piezoceramics modified with cryolite, as an example. For comparison, values for a soft ceramic doped with Nd are also given in Table 14. Besides the dielectric constant $\in$, the strain S under the action of the electrical field strength E was also measured according to the relation for the piezoelectric effect $S_3 = d_{33} \times E_3$ to determine the charge constant d (the index 3 denotes the direction of the polar axis, adjusted by poling, and the applied field strength). Furthermore, the specific energy and the loss factor are indicated.

TABLE 13

Several properties determined in the small-signal and large-signal measurement mode for disk-shaped specimens of MLP (11 × 11 mm2) and actuators with Ag/Pd inner electrodes (n = 350, dielectric thickness d = 80 µm, 6.8 × 6.8 mm2) based on the ceramic

[Pb(Zr$_a$Ti$_{1-a}$)O$_3$]$_{1-b-c}$[KNbO$_3$]$_b$[Sr$_4$(Sr$_{2-2x/3}$Nb$_{2+2x/3}$)O$_{11+x}$V$_{0;1-x}$]$_c$ · 0.01 PbO

| dielectric $\in$ constant | $d_{33}$ m/V | $\frac{\varepsilon \cdot \varepsilon_0}{d_{33}^2}$ J/m$^3$ | loss factor or loss % |
|---|---|---|---|
| (Pb(Zr$_{0.53}$Ti$_{0.47}$)O$_3$] · [Sr$_{5.667}$Nb$_{2.333}$O$_{11.5}$V$_{0.5}$]$_{0.0049}$ + 0.01 PbO | | | |
| 2 V/mm  1662 | — | — | 0.0177 |
| 2 kV/mm  2708 | 731 · 10$^{-12}$ | 4.49 · 10$^{-10}$ | 44.1% |
| [Pb(Zr$_{0.535}$Ti$_{0.465}$)O$_3$] · [Sr$_{5.333}$Nb$_{2.667}$O$_{12}$]$_{0.0044}$ + 0.01 PbO | | | |
| 2 V/mm  1742 | | | |
| 2 kV/mm  2881 | 722 · 10$^{-12}$ | 4.89 · 10$^{-10}$ | 46.9% |
| [Pb(Zr$_{0.53}$Ti$_{0.47}$)O$_3$] · [KNbO$_3$]$_{0.002}$[Sr$_{5.333}$Nb$_{2667}$O$_{12}$]$_{0.0047}$ + 0.01 PbO | | | |
| 2 V/mm  1716 | — | — | 0.0178 |
| 2 kV/mm  2837 | 746 · 10$^{-12}$ | 4.51 · 10$^{-10}$ | 45.8% |
| [Pb(Zr$_{0.53}$Ti$_{0.47}$)O$_3$] · [KNbO$_3$]$_{0.007}$ [Sr$_{5.667}$Nb$_{2.333}$O$_{11.5}$V$_{0.5}$]$_{0.0035}$ + 0.01 PbO | | | |
| 2 V/mm  1675 | — | — | 0.0162 |
| 2 kV/mm  2827 | 688 · 10$^{-12}$ | 5.29 · 10$^{-10}$ | 47.0% |

TABLE 14

Several properties determined in the small-signal and large-signal measurement mode for disk-shaped specimens of MLP (11 × 11 × 0.7 mm3) and actuators with Ag/Pd inner electrodes (n = 350, dielectric thickness d = 80 μm, 6.8 × 6.8 mm2) based on the ceramic $Pb_{0.97}Nd_{0.02}V_{O.01}(Zr_{0.54}Ti_{0.46})O_3$ for MLP specimens and based on $Pb_{0.96}Nd_{0.02}Ag_{O.02}(Zr_{0.54}Ti_{0.46})O_3$ for actuators with Ag/Pd inner electrodes

|  |  | dielectric constant $\epsilon$ | $d_{33}$ in m/v | $(\epsilon \epsilon_0/d_{33}^2)$ in J/m$^3$ | loss factor or loss % |
|---|---|---|---|---|---|
| MLP | E = 2 V/mm |  |  |  |  |
|  | E = 2 kV/mm | 2428 | 661 10$^{-12}$ | 4.92 · 10$^{10}$ | η = 45% |
| Ak- | E = 2 V/mm | 1708 |  |  | tan δ = 0.016 |
| tor | E = 2 kV/mm | 3534 | 780 10$^{-12}$ | 5.14 · 10$^{10}$ | η = 45% |

The invention claimed is:

1. A material comprising:
a ceramic material having the empirical formula $A'_{1-b-c}B'_bC'_c$ where: $0<b\leq0.5$ and $0<c\leq0.01$;
wherein A' represents the composition $Pb(Zr_aTi_{1-a})O_3$ and $0.5\leq a\leq0.6$ and A' serves as host lattice for B' and C',
B' is an additive component of the perovskite lattice type and is selected from the following components:
$KNbO_3$,
$Pb(M^{II}_{1/2}M^{VI}_{1/2})O_3$ where $M^{II}$ is Zn, Co, Ni, Mn or Cu and where $M^{VI}$ is W,
$Pb(M^{III}_{1/2}M^{V}_{1/2})O_3$ where $M^{III}$ is Fe, Mn, Cr, or Ga and $M^V$ is Nb, Ta, or Sb,
$Pb(M^{III}_{1/2}M^{VI}_{1/3})O_3$ where $M^{III}$ is Fe, Mn, Cr, or Ga and $M^{VI}$ is W,
$Pb(Li^I_{1/4}M^V_{3/4})O_3$ where $M^V$ is Nb, Ta or Sb,
C' is a ceramic material of the cryolite lattice type which has the general formula
$A_4(B_{2-2x/3}Nb_{2+2x/3})O_{11+x}V_{1-x}$, where A comprises barium or strontium, where B comprises strontium, magnesium, or calcium, where V comprises an oxygen vacancy having a phase range and the parameter x is such that: $0\leq x<1$.

2. The ceramic material of claim 1, wherein C' comprises $Sr_4(Sr_{2-2x/3}Nb_{2+2x/3})O_{11+x}V_{1-x}$, where V comprises an oxygen vacancy, and where $0\leq x<1$.

3. The ceramic material of claim 1, wherein C' comprises $Sr_4(Ca_{2-2x/3}Nb_{2+2x/3})O_{11+x}V_{1-x}$, where V comprises an oxygen vacancy, and where: $0\leq x<1$.

4. The ceramic material of claim 1, wherein C' comprises $Sr_4(Mg_{2-2x/3}Nb_{2+2x/3})O_{11+x}V_{1-x}$, where V comprises an oxygen vacancy, and where $0\leq x<1$.

5. The ceramic material of claim 1, wherein C' comprises $Ba_4(Sr_{2-2x/3}Nb_{2+2x/3})O_{11+x}V_{1-x}$, where V comprises an oxygen vacancy, and where $0\leq x<1$.

6. The ceramic material of claim 1, wherein C' comprises $Ba_4(Ca_{2-2x/3}Nb_{2+2x/3})O_{11+x}V_{1-x}$, where V comprises an oxygen vacancy, and where $0\leq x<1$.

7. The ceramic material of claim 1, wherein C' comprises $Ba_4(Mg_{2-2x/3}Nb_{2+2x/3})O_{11+x}V_{1-x}$, where V comprises an oxygen vacancy, and where $0\leq x<1$.

8. A piezo-actuator comprising:
a stack comprised of piezoelectric ceramic layers and electrode layers interspersed among the piezoelectric ceramic layers;
wherein at least one of the piezoelectric ceramic layers comprises a ceramic material according to claim 1.

9. The ceramic material of claim 1 which is substantially free of $KNbO_3$.

* * * * *

UNITED STATES PATENT AND TRADEMARK OFFICE
CERTIFICATE OF CORRECTION

PATENT NO. : 8,858,822 B2  
APPLICATION NO. : 10/586035  
DATED : October 14, 2014  
INVENTOR(S) : Adalbert Feltz, Heinz Florian and Michael Schossmann Page 1 of 1

It is certified that error appears in the above-identified patent and that said Letters Patent is hereby corrected as shown below:

In the Claims,

Column 9, Claim 1, Line 30:

Delete "$Pb(M^{III}_{1/2}M^{VI}_{1/3})O_3$" and insert -- $Pb(M^{III}_{2/3}M^{VI}_{1/3})O_3$ --

Signed and Sealed this  
Seventeenth Day of February, 2015

Michelle K. Lee  
*Deputy Director of the United States Patent and Trademark Office*